United States Patent
Lu et al.

(10) Patent No.: US 9,449,748 B2
(45) Date of Patent: Sep. 20, 2016

(54) ROTATABLE SUPPORTING ASSEMBLY

(71) Applicant: HON HAI PRECISION INDUSTRY CO., LTD., New Taipei (TW)

(72) Inventors: Li-Chin Lu, New Taipei (TW); Far-Tsair Huang, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 208 days.

(21) Appl. No.: 14/264,561

(22) Filed: Apr. 29, 2014

(65) Prior Publication Data

US 2015/0028974 A1    Jan. 29, 2015

(30) Foreign Application Priority Data

Jul. 24, 2013    (CN) .......................... 2013 1 0313530

(51) Int. Cl.
| | |
|---|---|
| *H01F 7/08* | (2006.01) |
| *H01F 7/20* | (2006.01) |
| *H05K 3/00* | (2006.01) |

(52) U.S. Cl.
CPC ............. *H01F 7/206* (2013.01); *H05K 3/0008* (2013.01); *H05K 2203/0165* (2013.01)

(58) Field of Classification Search
CPC .......... H01F 7/206; H05K 2203/0165; H05K 3/0008

USPC ................................. 335/220, 285, 289, 290
See application file for complete search history.

(56) References Cited

U.S. PATENT DOCUMENTS

| | | | |
|---|---|---|---|
| 5,022,171 A * | 6/1991 | Norfolk ................. | G09F 9/375 40/447 |
| 9,244,497 B2 * | 1/2016 | Tsai ....................... | G06F 1/1681 |
| 2009/0144934 A1 * | 6/2009 | Kitagawa .............. | G06F 1/1616 16/320 |
| 2014/0146484 A1 * | 5/2014 | Chen ..................... | G06F 1/1616 361/728 |
| 2014/0211380 A1 * | 7/2014 | Tsai ....................... | G06F 1/162 361/679.01 |

* cited by examiner

*Primary Examiner* — Bernard Rojas
(74) *Attorney, Agent, or Firm* — Zhigang Ma

(57) ABSTRACT

A supporting assembly includes a base, a rotatable member, an electromagnet, and a switch. The base includes a main body and a first connection member. The first connection member is made of magnetic material. The first connection member protrudes from the main body and defines a first hole. The rotatable member includes a supporting member and a first shaft. The first shaft protrudes from the supporting member and passes through the first hole, thereby allowing the rotatable member to be rotatably connected to the base. The electromagnet is arranged on the supporting member and adjacent to the first shaft. The switch is electrically coupled between an external power supply and the electromagnet, and establishes or cuts off electrical connection between the external power supply and the electromagnet when the switch is turned on or turned off.

5 Claims, 3 Drawing Sheets

ROTATABLE SUPPORTING ASSEMBLY

FIELD

The present disclosure relates to supporting assemblies, and particularly to a supporting assembly capable of being positioned at a desired angle.

BACKGROUND

During processing of a printed circuit board (PCB), the PCB needs to be rotated to different desired positions for processing.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one." The references "a plurality of" and "a number of" mean "at least two."

Embodiments of the present disclosure will be described with reference to the accompanying drawings. In the following disclosure the term "coupled" is defined as connected, whether directly or indirectly through intervening components, and is not necessarily limited to physical connections. The connection can be such that the objects are permanently connected or releasably connected.

Figure 1:
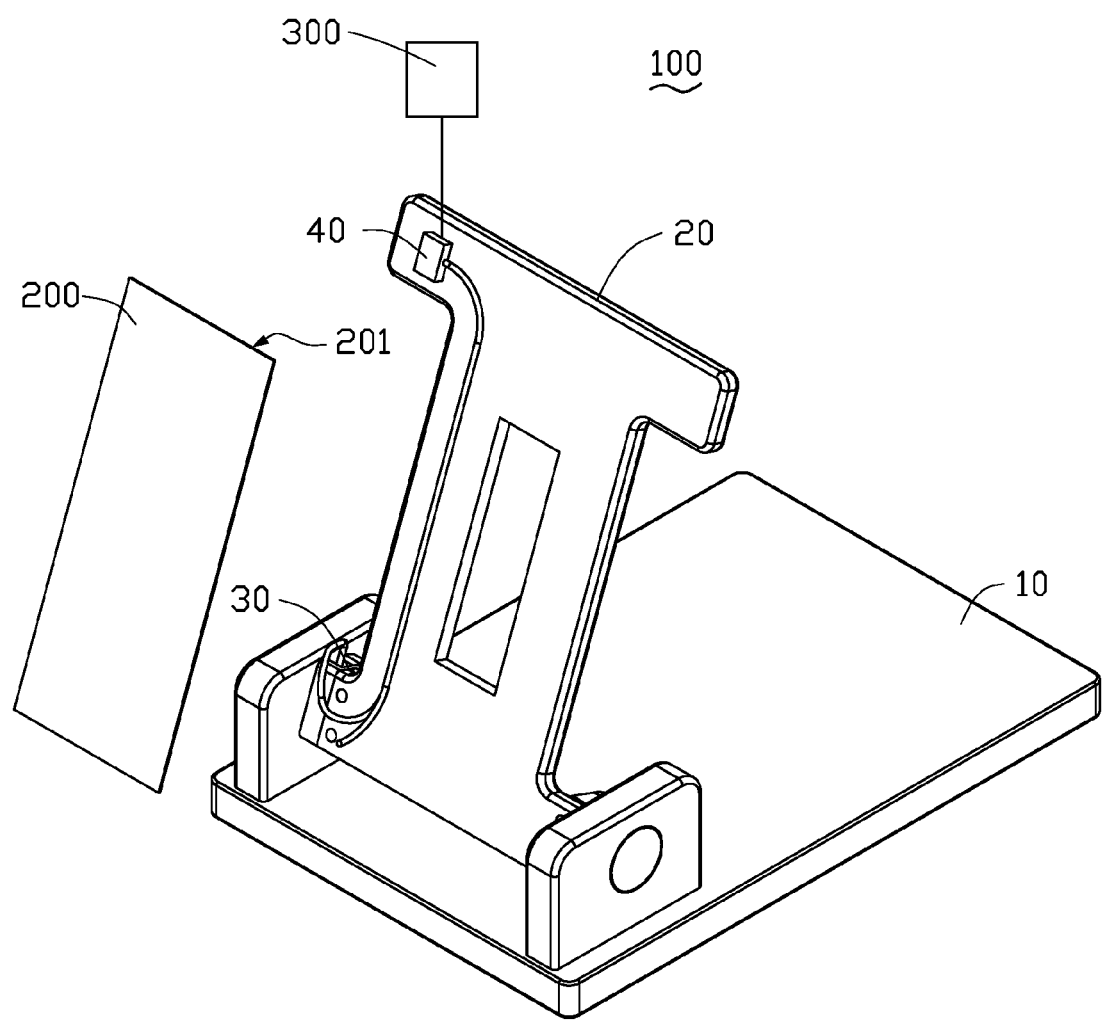
FIG. 1 is a schematic view of an embodiment of a supporting assembly.
Figure 2:
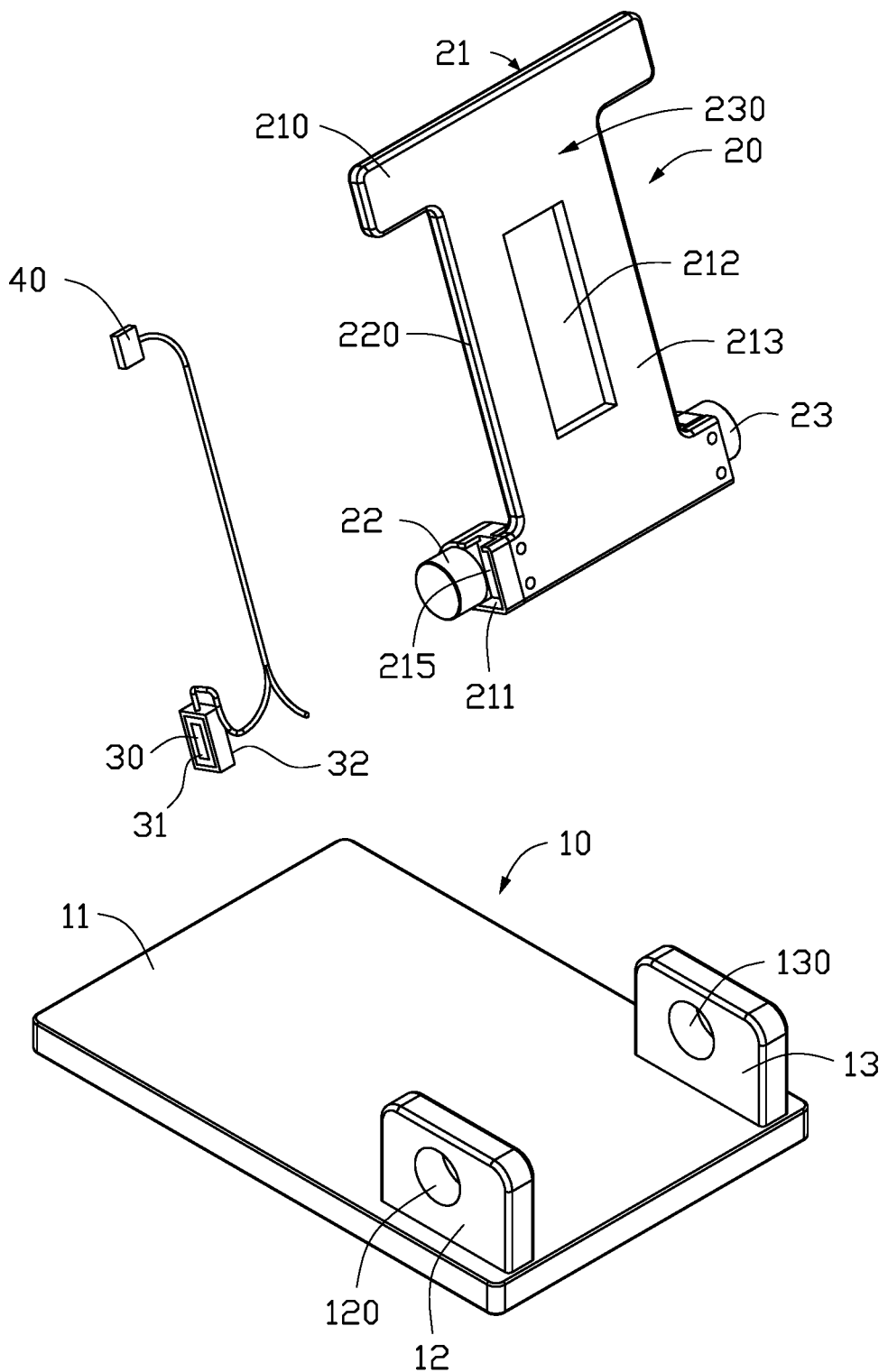
FIG. 2 is an exploded view of the supporting assembly of FIG. 1.
Figure 3:
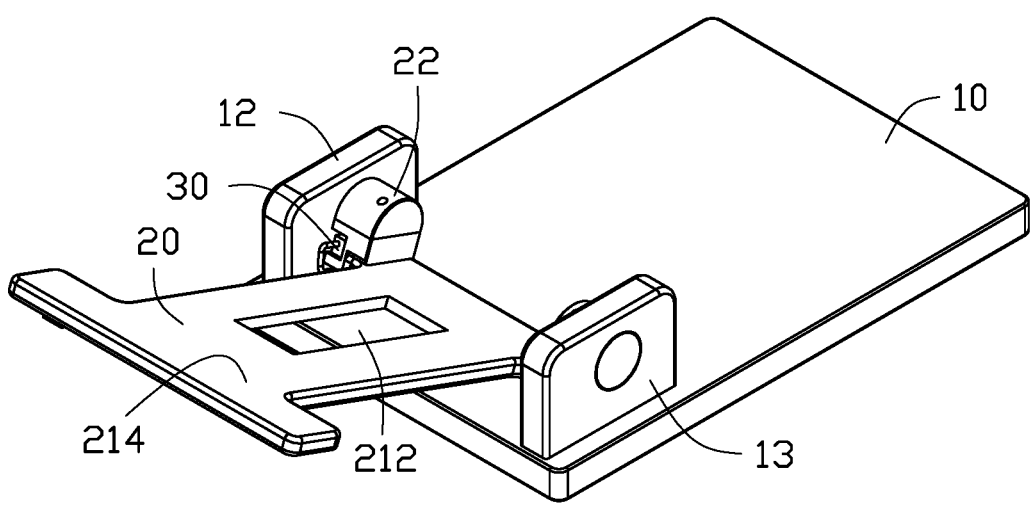
FIG. 3 is similar to FIG. 1, but showing a rotatable member of the supporting assembly being rotated to another position.

FIGS. 1-3 illustrate an embodiment of a supporting assembly 100. The supporting assembly 100 includes a base 10, a rotatable member 20, an electromagnet 30, and a switch 40. The rotatable member 20 is rotatably coupled to the base 10. The electromagnet 30 is arranged on the rotatable member 20. The switch 40 is electrically coupled to the electromagnet 30. The electromagnet 30 produces a magnetic field to fix a position of the rotatable member 20 relative to the base 10 when the switch 40 is turned on.

The base 10 includes a main body 11, a first connection member 12, and a second connection member 13. The first connection member 12 and the second connection member 13 protrude from the main body 11 and are spaced from each other. The first connection member 12 is made of magnetic materials, such as a ferrous material. The first connection member 12 defines a first hole 120. The second connection member 13 defines a second hole 130 coaxial to the first hole 120.

The rotatable member 20 is arranged between the first connection member 12 and the second connection member 13. As shown in FIG. 2, the rotatable member 20 includes a supporting member 21, a first shaft 22, and a second shaft 23. The supporting member 21 includes a plate 210 and a number of limiting members 220 protruding from a side edge of a same surface of the plate 210. The limiting members 220 and the plate 210 cooperatively bound a receiving space 230 to receive a product 200, such as a PCB. The first shaft 22 and the second shaft 23 respectively protrude from opposite sides of the plate 210 and are located at one end portion of the plate 210. The first shaft 22 and the second shaft 23 are respectively rotatably received in the first hole 120 and the second hole 130. Thus, the rotatable member 20 is rotatably coupled to the base 10. The plate 210 defines a recessed portion 211 in the side where the first shaft 22 protrudes from. In the embodiment, an opening 215 of the recessed portion 211 faces the first connection member 12.

In the illustrated embodiment, the electromagnet 30 is fixed in the recessed portion 211. The switch 40 can be attached to the base 10 or the rotatable member 20. The switch 40 is electrically coupled between an external power supply 300 and the electromagnet 30. The switch 40 can establish or cut off electrical connection between the external power supply 300 and the electromagnet 30 when the switch 40 is turned on or turned off. A current flows from the external power supply 300 to the electromagnet 30 when the switch 40 is turned on. The electromagnet 30 attracts the first connection member 12 due to the magnetic force of the electromagnet 30. Thus, the position of rotatable member 20 is still relative to the first connection member 12 through the electromagnet 30, and the position of the rotatable member 20 relative to the base 10, is fixed. The magnetic force of the electromagnet 30 is turned off when the switch 40 is turned off. Thus, the rotatable member 20 can be rotated to a desired position relative to the base 10.

The plate 210 further defines a through groove 212 from an upper portion 213 of the plate 210 to a lower portion 214 of the plate 210. A backside 201 (shown in FIG. 1) of the product 200 can be processed through the through groove 212 when the rotatable member 20 is rotated to a desired position. Thus, the product 200 does not need to be taken out of the receiving space 230 to process the backside of the product 200.

In another embodiment, the electromagnet 30 is movably received in the recessed portion 211. When the switch 40 is turned on, the current flows from the external power supply 300 to the electromagnet 30, causing the electromagnet 30 to produce the magnetic field. A first end 31 of the electromagnet 30 moves out of the recessed portion 211 to adhere to the first connection member 12, and a second end 32 of the electromagnet 30 is still received in the recessed portion 211. Thus, the electromagnet 30 can limit the rotation of the rotatable member 20 relative to the base 10.

It is believed that the present embodiments and their advantages will be understood from the foregoing description, and it will be apparent that various changes may be made thereto without departing from the scope of the disclosure or sacrificing all of its material advantages, the examples described herein merely being exemplary embodiments of the present disclosure.

What is claimed is:

1. A supporting assembly comprising:
   a base comprising a main body and a first connection member, the first connection member being made of magnetic material, the first connection member protruding from the main body and defining a first hole;

a rotatable member comprising a supporting member and a first shaft, the first shaft protruding from the supporting member and passing through the first hole, allowing the rotatable member to be rotatably coupled to the base;

an electromagnet arranged on the supporting member and adjacent to the first shaft; and a switch electrically coupled between an external power supply and the electromagnet, and establishing or cutting off electrical connection between the external power supply and the electromagnet when the switch is turned on or turned off;

wherein a current flows from the external power supply to the electromagnet when the switch is turned on, the electromagnet attracts the first connection member due to the magnetic force of the electromagnet, thereby fixing the position of the rotatable member relative to the base;

wherein the magnetic force of the electromagnet is turned off when the switch is turned off, whereby the rotatable member is capable of being rotated to a desired position relative to the base;

the supporting member defines a recessed portion in a side where the first shaft protrudes from, and the electromagnet is arranged in the recessed portion; and an opening of the recessed portion faces the first connection member and the electromagnet is fixed in the recessed portion.

2. The supporting assembly as described in claim 1, wherein the base further comprises a second connection member, the second connection member protrudes from the base and are spaced from the first connection member, the second connection member defines a second hole coaxial to the first hole; the rotatable member comprises a second shaft, the first shaft and the second shaft respectively protrude from opposite sides of the supporting member, the second shaft passes through the second hole.

3. The supporting assembly as described in claim 1, wherein the supporting member comprises a plate and a plurality of limiting members, each limiting member respectively protrudes from one side edge of a same surface of the plate, the limiting members and the plate cooperatively bound a receiving space to receive a product.

4. The supporting assembly as described in claim 1, wherein the electromagnet is movably received in the recessed portion; a first end of the electromagnet moves out of the recessed portion to adhere to the first connection member when the switch is turned on, and a second end of the electromagnet is still received in the recessed portion, the electromagnet thereby limiting the rotation of the rotatable member relative to the base.

5. The supporting assembly as described in claim 1, wherein the supporting member defines a through groove from an upper portion of the supporting member to a lower portion of the supporting member, a backside of the product is capable of being processed through the through groove when the rotatable member is rotated to a desired position.

* * * * *